US007146010B1

(12) United States Patent
Heed et al.

(10) Patent No.: US 7,146,010 B1
(45) **Date of Patent: *Dec. 5, 2006**

(54) TWO METHODS AND TWO DEVICES FOR PROCESSING AN INPUT AUDIO STEREO SIGNAL, AND AN AUDIO STEREO SIGNAL REPRODUCTION SYSTEM

(75) Inventors: Christer Heed, Huddinge (SE); Fredrik Gunnarsson, Huddinge (SE)

(73) Assignee: Embracing Sound Experience AB, Uppsala (SE)

( * ) Notice: Subject to any disclaimer, the term of this patent is extended or adjusted under 35 U.S.C. 154(b) by 623 days.

This patent is subject to a terminal disclaimer.

(21) Appl. No.: 10/129,615

(22) PCT Filed: Jun. 19, 2000

(86) PCT No.: PCT/SE00/01301

§ 371 (c)(1), (2), (4) Date: May 8, 2002

(87) PCT Pub. No.: WO01/39548

PCT Pub. Date: May 31, 2001

(30) Foreign Application Priority Data

Nov. 25, 1999 (WO) ...................... PCT/SE99/02193

(51) Int. Cl.
*H04R 5/00* (2006.01)
*H03G 3/00* (2006.01)
*H03G 5/00* (2006.01)

(52) U.S. Cl. ............................ 381/1; 381/61; 381/303; 381/19; 381/98

(58) Field of Classification Search ................ 381/1–3, 381/10, 98–99
See application file for complete search history.

(56) References Cited

U.S. PATENT DOCUMENTS 2,093,540 A 9/1937 Blumlein
2,836,662 A 5/1958 Vanderlyn
2,845,491 A 7/1958 Bertram (Continued)

FOREIGN PATENT DOCUMENTS

EP 0 773 702 A2 5/1997

(Continued)

OTHER PUBLICATIONS

B.B. Bauer, "Phasor Analysis Of Some Stereophonic Phenomena," J. Acous. Soc. Am., Vol. 33, No. 11 (Nov. 1961).

(Continued)

*Primary Examiner*—Laura A. Grier
(74) *Attorney, Agent, or Firm*—Birch, Stewart, Kolasch & Birch, LLP

(57) ABSTRACT

The present invention relates to methods and devices for processing one or the other of two types of common input audio stereo signals so that the output signals will reproduce normally wide stereo sound from an audio stereo reproduction system comprising a pair of identical loudspeakers positioned adjacent or close to each other. Thus, the invention relates partly to a method and a device for producing that specific pair of left and right output signals from one kind (M+S) of input signals, and partly to a method and a device for producing a similar type of left and right output signals from another kind (L+R) of input signals. Finally, the invention relates to an audio stereo signal reproduction system comprising a pair of identical louspeakers positioned adjacent or close to each other and intended for reproduction of normally wide stereo sound from one (M+S) of said kinds of input signals.

30 Claims, 4 Drawing Sheets

U.S. PATENT DOCUMENTS

| | | | | |
|---|---|---|---|---|
| 3,241,631 | A | | 3/1966 | Manieri |
| 3,560,656 | A | | 2/1971 | Gilbert |
| 3,892,624 | A | | 7/1975 | Shima et al. |
| 3,970,787 | A | | 7/1976 | Searle |
| 4,069,394 | A | | 1/1978 | Doi et al. |
| 4,149,036 | A | | 4/1979 | Okamoto et al. |
| 4,349,697 | A | * | 9/1982 | Skabla ........................ 381/63 |
| 4,356,349 | A | | 10/1982 | Robinson |
| 4,394,537 | A | | 7/1983 | Shima et al. |
| 4,418,243 | A | | 11/1983 | Fixler |
| 4,572,325 | A | | 2/1986 | Schupbach |
| 4,596,034 | A | | 6/1986 | Moncrieff |
| 4,819,269 | A | * | 4/1989 | Klayman .................... 381/307 |
| 4,837,826 | A | | 6/1989 | Schupbach |
| 5,117,459 | A | | 5/1992 | McShane |
| 5,502,772 | A | * | 3/1996 | Felder ........................ 381/386 |
| 5,546,468 | A | | 8/1996 | Beard |
| 5,553,147 | A | | 9/1996 | Pineau |
| 5,579,395 | A | * | 11/1996 | Horl .............................. 381/1 |
| 5,579,396 | A | | 11/1996 | Iida et al. |
| 5,850,454 | A | | 12/1998 | Hawks |
| 5,870,484 | A | | 2/1999 | Greenberger |
| 5,892,830 | A | * | 4/1999 | Klayman ....................... 381/1 |
| 5,970,153 | A | | 10/1999 | Petroff |
| 6,169,812 | B1 | | 1/2001 | Miller |
| 6,590,983 | B1 | | 7/2003 | Kraemer |
| 6,731,765 | B1 | | 5/2004 | Sotome |
| 6,991,289 | B1 | | 1/2006 | House |
| 2004/0170281 | A1 | * | 9/2004 | Nelson et al. ................ 381/17 |
| 2005/0201582 | A1 | | 9/2005 | Hughes, II et al. |
| 2005/0221867 | A1 | | 10/2005 | Zurek et al. |

FOREIGN PATENT DOCUMENTS

| | | | |
|---|---|---|---|
| WO | 97/30566 | A1 | 8/1997 |
| WO | WO-98/36614 | A1 | 8/1998 |
| WO | WO-99/33173 | A1 | 7/1999 |
| WO | WO-01/39547 | A1 | 5/2001 |
| WO | WO-01/39548 | A1 | 5/2001 |

OTHER PUBLICATIONS

John Eargle, “Handbook of Recording Engineering,” USBNO-442-0053-9, pp. 258-259.

Michael Gayford, “Microphone Engineering Handbook,” ISBN 07506 1199 5, pp. 395-396.

Timothy M. Bock, Crown International, Inc. Elkhart, Indiana, and D. (Don) B. Keele, Jr., Techron, Division of Crown International, Inc., The Effects of Interaural Crosstalk on Stereo Reproduction and Minimizing Interaural Crosstalk in Nearfield Monitoring by the use of a Physical Barrier: Part 1, Presented at the 81st Convention, 1986, Nov. 12-16, Los Angeles, CA, An Audio Engineering Society Preprint.

* cited by examiner

TWO METHODS AND TWO DEVICES FOR PROCESSING AN INPUT AUDIO STEREO SIGNAL, AND AN AUDIO STEREO SIGNAL REPRODUCTION SYSTEM

This application is the national phase under 35 U.S.C. §371 of PCT International Application No. PCT/SE00/01301 which has an International filing date of Jun. 19, 2000, which designated the United States of America.

FIELD OF THE INVENTION

The present invention relates in general to a method and a device for processing and reproducing an audio stereo signal and to a corresponding audio stereo signal reproduction system. More particularly, the present invention relates to an audio stereo signal reproduction system, and to a method of processing an audio stereo signal for retaining the apparent stereo image emitted from such a reproduction system.

BACKGROUND OF THE INVENTION

A large number of methods and systems exist intended for faithful reproduction of the sound experienced by a listener at the recording position. The only one of these that is able to truly reproduce the stereo effect, i.e. the impression of the different sound sources originating from different spatial positions, is using stereo headphones. Listening to a recorded stereo sound using headphones, the listener may perceive a stereo image identical to the image that would have been perceived at the recording site. This method is however not suitable for reproduction of stereo sound to an audience consisting of more than one listener. To overcome this drawback, audio stereo reproduction systems comprising two, or more, loudspeakers are used for reproducing stereo sound to an audience. Most of these systems are based on a pair of widely spaced loudspeakers, and true reproduction of the stereo effect, both in terms of relative intensity between the sound perceived by the listeners' two ears and the time difference between these, can be perceived only at a single position in relation to the loudspeakers. This implies that only one listener in an audience can experience a truly correct stereo effect. All other members of the audience will therefore experience a distorted stereo effect. Different ways to widen the area over which the perceived stereo impression is nearly correct have been attempted, with varying degrees of success.

Physically separating the two loudspeakers a distance large enough for enabling reproduction of the stereo impression to at least one listener is generally impractical, and in certain cases impossible. Examples of such cases are single unit stereo radio or CD players with integral loudspeakers, or reproduction of stereo sound to several listeners in cars or small rooms. Adjusting the relative intensities of the side and the mid signals reproduced by an AB stereo system, to increase the perceived stereo width might improve the impression of stereo width, but might also distort the stereo image, and it is not recommended to shift the ratio between the two signals by more that 3 dB. Other methods of improving the perceived stereo effect from narrowly separated loudspeakers have also been suggested, but have proven to give limited effect.

SUMMARY OF THE INVENTION

It is an object of the present invention to provide a method and a device for processing an audio stereo signal, such that it can be reproduced with a high degree of fidelity in the perceived stereo effect over a larger area than possible with previous methods.

It is another object of the present invention to provide a method and a device for processing an audio stereo signal, such that it can be reproduced with a high degree of fidelity in the perceived stereo image, using a pair of loudspeakers being situated in immediate vicinity of each other.

According to the present invention, the method and the device produces a left and a right output signal from an input audio stereo signal pair. The left output signal is equivalent to the sum of the mid input signal (M) attenuated by a factor $\alpha$ and the side input signal (S), and the right output signal is equivalent to the sum of the mid input signal (M) attenuated by the factor $\alpha$ and the side signal (S) phase shifted 180°. The left and the right output signal form an output audio stereo signal. Finally, the output stereo signal is directed to an audio stereo signal reproduction system, comprising a pair of loudspeaker units located in close proximity to each other.

It is yet another object of the present invention to provide a loudspeaker system, comprising at least one pair of identical loudspeaker elements, suited for reproducing an audio stereo signal processed according to the presented method. A pair of two identical loudspeaker elements does here mean that the elements have essentially identical transmission functions, i.e. they respond in an essentially identical way to an electrical input signal in terms of the sound waves emitted from the elements.

According to the present invention, the system comprises at least one pair of identical loudspeaker elements positioned on a baffle with separated resonating volumes that acoustically isolates the two elements from each other. The loudspeaker elements of said pair of loudspeaker elements are positioned symmetrically on opposite sides of an imaginary dividing plane. The loudspeaker elements of said pair of elements are positioned with a distance between the centres of the elements of less than one quarter of the shortest wavelength emitted by the elements, or, if the shortest wavelength emitted by the elements is less than 68 cm, less than 17 cm. Preferably, the elements are positioned adjacent to each other.

According to another aspect of the invention, the system comprises more than one such pair of loudspeaker elements, where each pair share a common dividing plane.

According to yet another aspect of the invention, the system may also comprise a processing device of the kind described above.

DESCRIPTION OF A PREFERRED EMBODIMENT

Figure 1:
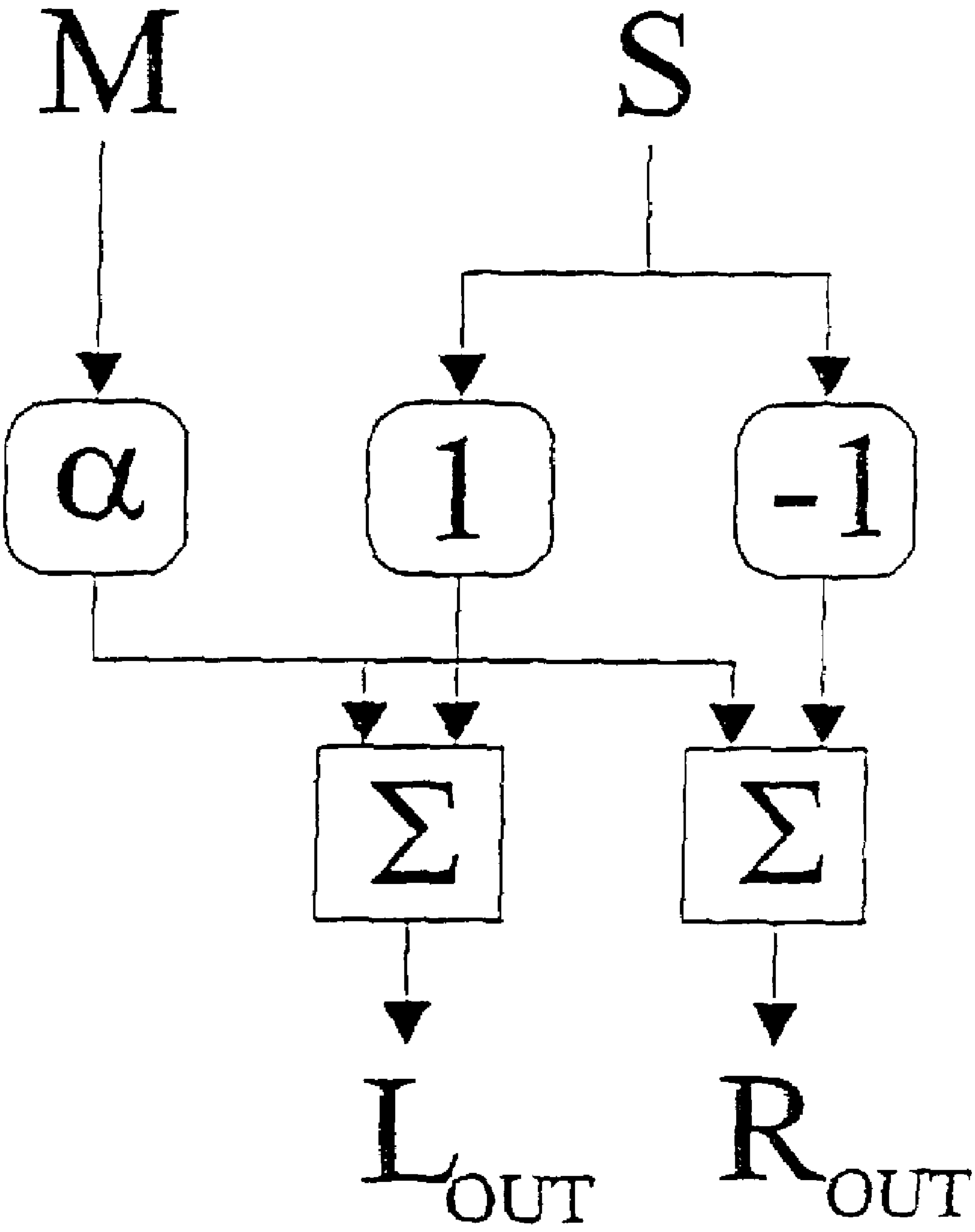
FIG. 1 is a block diagram illustrating the processing method according to the invention for M-S signals.

FIG. 1 illustrates the method of processing an audio stereo signal, and thus also the function of a device, according to the present invention for M-S input signals. The input audio stereo signal comprises a mid signal M, and a side signal S, corresponding to the sum of the left, L, and right, R, input stereo signals, and the difference between the left, L, and right, R, input stereo signals, respectively. According to the method, the output stereo signal $L_{OUT}$, which is to be sent to a left sound reproducing unit 2' is the sum of the side signal S, and the mid signal M multiplied by a attenuating factor α, while the output stereo signal $R_{OUT}$, which is to be sent to a right sound reproducing unit 2" is the sum of the inverted side signal, S, and the mid signal M multiplied by a attenuating factor α. This can be expressed mathematically as $$\begin{bmatrix} L_{OUT} \\ R_{OUT} \end{bmatrix} = \begin{bmatrix} \alpha & 1 \\ \alpha & -1 \end{bmatrix} \begin{bmatrix} M \\ S \end{bmatrix}.$$

Inverting the side signal is equivalent to negating it or phase shifting it 180 degrees.

The mid signal M is attenuated a factor α, which, assuming the recording system as well as previous and subsequent stereo signal processing and stereo reproducing systems are optimal, would typically be −6 dB to −9 dB. The attenuated mid signal is then added to the S and −S signals, respectively, and the resulting pair of signals are fed to a pair of audio signal reproduction elements. Reproducing the resulting signals by an ordinary audio reproduction system with widely separated loudspeaker elements does however not give a satisfactory result, and only by using the audio stereo signal reproduction system according to the present invention, a stereo effect is reproduced with fidelity.

In a general case the attenuation factor α is adapted to optimise the stereo effect perceived by the listener, and is allowed to vary in an interval from −3 dB to −10 dB. It has been found that the optimum value is dependent upon the angle of distribution of the sound emitted from the loudspeaker elements. For elements with a narrow distribution angle, the optimum value is approximately −6 dB, while for elements with a wide distribution angle, the optimum value is approximately −9 dB.

An output stereo signal $L_{OUT}$, $R_{OUT}$, may be multiplied by a normalisation factor, which compensates for the slight change in signal power but, generally, attenuating or amplifying an output signal is known in the art.

Figure 2:
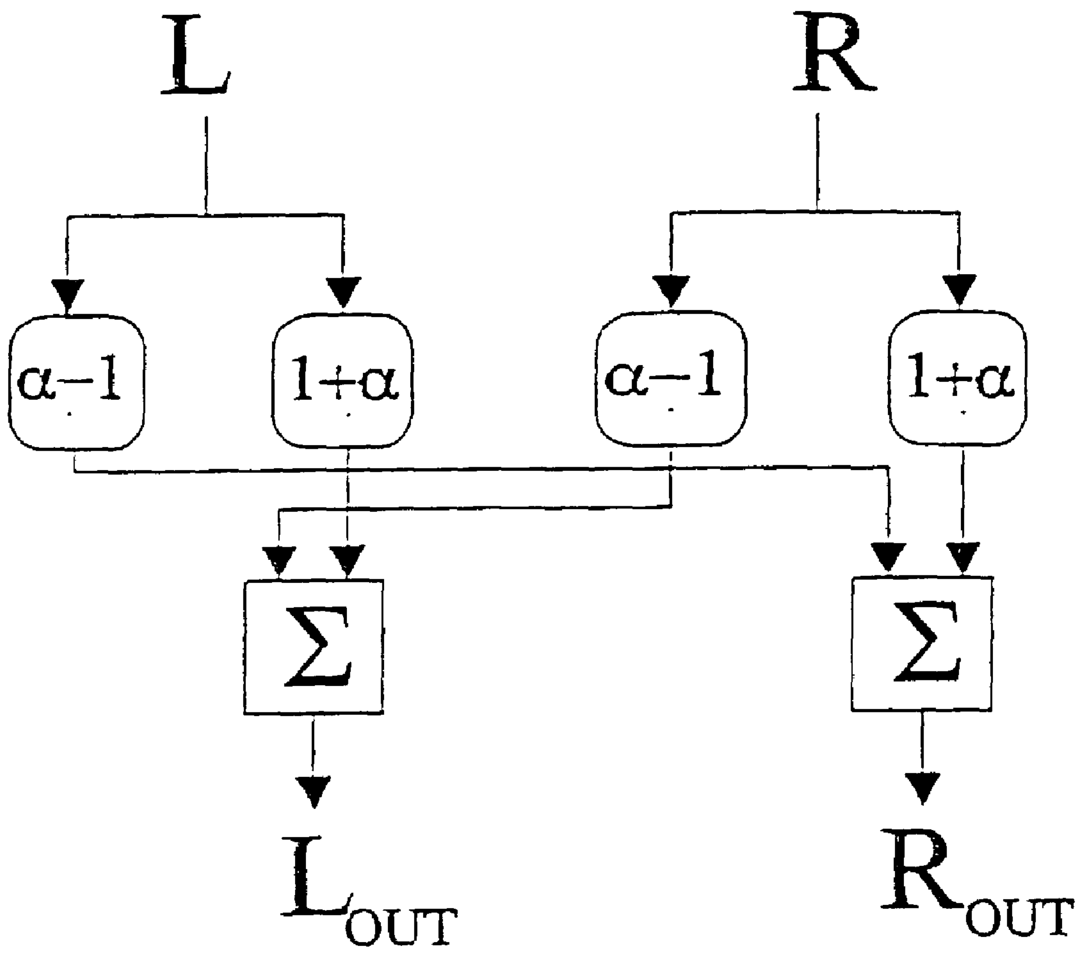
FIG. 2 is a block diagram illustrating the processing method according to the invention for L-R signals.

FIG. 2 illustrates the same method of processing an audio stereo signal according to the present invention as above, but for L-R input signals, The input audio stereo signal comprises a left, L, and a right, R, stereo signal, corresponding to half the sum of the mid, M, and the side S stereo signals and half the difference between the mid signal M, and the side signal S, respectively. According to the method, the left output stereo signal, $L_{OUT}$, is the sum of the left stereo signal, L, multiplied by a factor of 1−α, and the right stereo signal, R, multiplied by a factor of α−1, while the right output stereo signal $R_{OUT}$, is the sum of the left stereo signal, L, multiplied by a factor of α−1, and the right stereo signal, R, multiplied by a factor of 1+α. This can be expressed mathematically as $$\begin{bmatrix} L_{OUT} \\ R_{OUT} \end{bmatrix} = \begin{bmatrix} 1+\alpha & \alpha-1 \\ \alpha-1 & 1+\alpha \end{bmatrix} \begin{bmatrix} L \\ R \end{bmatrix}.$$

The two seemingly different methods described above are obviously identical in terms of the resulting output, as the R and L signals can be found by a linear transformation of the M and S signals. Mathematically, this is shown by the transformation.

$$\begin{bmatrix} L_{OUT} \\ R_{OUT} \end{bmatrix} = \begin{bmatrix} \alpha & 1 \\ \alpha & -1 \end{bmatrix} \begin{bmatrix} M \\ S \end{bmatrix} = \begin{bmatrix} \alpha & 1 \\ \alpha & -1 \end{bmatrix} \begin{bmatrix} 1 & 1 \\ 1 & -1 \end{bmatrix} \begin{bmatrix} L \\ R \end{bmatrix} = \begin{bmatrix} 1+\alpha & \alpha-1 \\ \alpha-1 & 1+\alpha \end{bmatrix} \begin{bmatrix} L \\ R \end{bmatrix}.$$

Generally, therefore, the method could equivalently be used for any input terms which can be described as a linear transformation of the R and L signals or the M and S signals, but as a matter of convenience, the method is exemplified using the M and S, and the R and L pictures, respectively. The method should therefore be interpreted as a method having an output, which is equivalent to S+αM and −S+αM, whether the input signals actually comprises an M and S signal, or if these signals can be derived from the input signals, such as is the case if the input signals comprises the L and R signals, or any other signals which can be linearly transformed into the M and S signals.

The method may produce the M and S signals during an intermediate step in the process, but it does not imply that these have to be produced.

Figure 3:
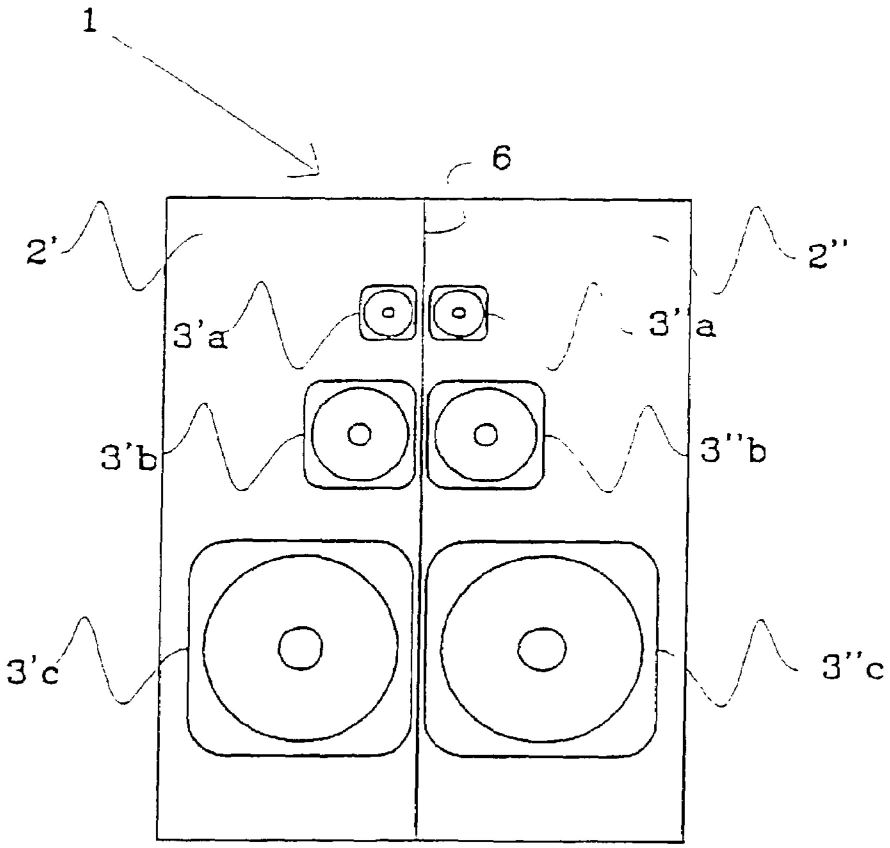
FIG. 3 is a front view of a first embodiment of a loudspeaker system.

FIG. 3 shows a preferred embodiment of the audio stereo signal reproduction system according to the present invention. The sound reproduction system 1 comprises two sound reproducing units 2' and 2", each of which comprises one or several in this case three, loudspeaker elements 3'*a*, 3'*b*, 3'*c* and 3"*a*, 3"*b*, 3"*c*. As shown, the sound reproduction system 1 could include one common enclosure with a barrier 6 between the two sound reproducing units 2' and 2", acoustically isolating the resonator volumes of the two units from each other. The term acoustical isolation does here imply that no, or little, sound is transferred from one resonator volume to the other. Alternatively it could consist of two separate units, placed in immediate vicinity of each other, or even being attached to each other. In each instance, each pair of corresponding loudspeaker elements in each of the sound reproducing units should be positioned symmetrically with respect to the separating plane, which in the illustrated embodiment would be defined by the barrier 6, in order to achieve a uniform sound pattern being emitted by each pair of loudspeaker elements 3'*a*, 3"*a*, etc. In addition, each loudspeaker element 3'*a*, 3"*a* etc. of each pair should be positioned as close to the others as practically possible in order to get minimal coloration caused by lobing in the resultant emitted sound pattern due to interference between the loudspeaker elements. This is achieved when the distance between the loudspeaker elements is smaller than one quarter of the wavelength of the sound being emitted. Achieving this implies that higher frequency loudspeaker elements should be put closer to each other than lower frequency loudspeaker elements.

For sound reproduction systems employing low (first or second) order filters for separating out the parts of the frequency intervals to be reproduced by the mid and high frequency loudspeaker elements, respectively, a comparatively large frequency interval remains which is partially reproduced by both the mid and high frequency loudspeaker elements. This effect will distort the fidelity of the stereo reproduction, and in such a case, it may me preferred to position the mid and high frequency loudspeaker elements in line with each other horizontally. To compensate for the high frequency loudspeaker elements in this case not being positioned as close to each other as possible, the mid signal attenuation factor α is preferably frequency dependent, α(f), where f is the frequency this also implies to when the speakers physically cannot be placed closer to each other than the distance of the wavelengths emitted by the elements.

Figure 4:
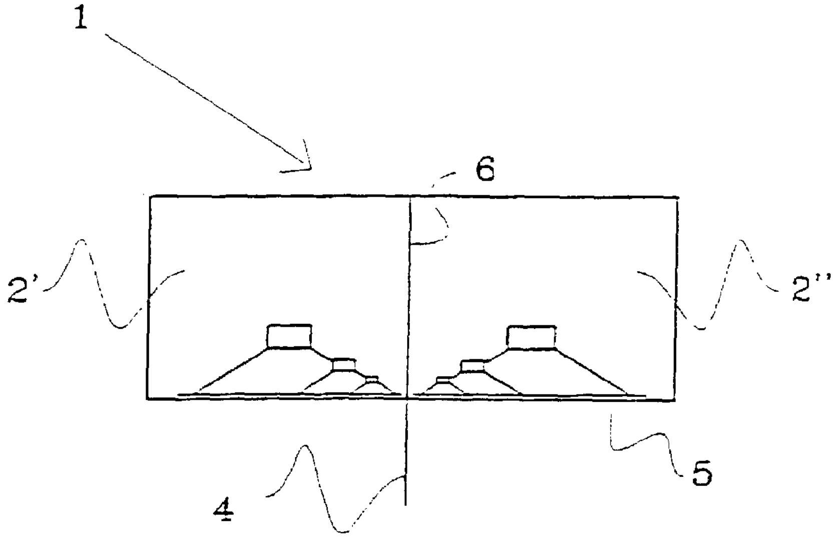
FIG. 4 is a partial cross sectional top view of the loudspeaker system shown in FIG. 3.

In FIG. 4 a plate element 4 positioned between the sound reproducing units 2' and 2" is more clearly illustrated. This optional element serves the purpose of enhancing the perceived stereo effect for the mid to high frequency part of the audio spectrum. The plate element 4 is positioned symmetrically with respect to the sound reproducing units and extends essentially orthogonally from the front surface of the sound reproducing units. Its shape and extension from the front surface are adapted to the acoustical properties of the environment, in which the audio stereo signal reproduction system is to be used, and by the properties of the loudspeaker elements 3. Optimally, it extends from the front surface of the loudspeaker element a distance equivalent to half the distance between the centres of the elements in one pair of elements. The acoustical properties of the plate element should be neutral but may be constructed in any type of material that avoids that the sound waves emitted from the two elements in one pair of elements mix with each other until the sound waves have propagated a distance equal to the extent of the plate element 4. It may be retractable and extendable in order to optimise the performance of the system when the acoustical properties of the surroundings are varying.

Figure 5:
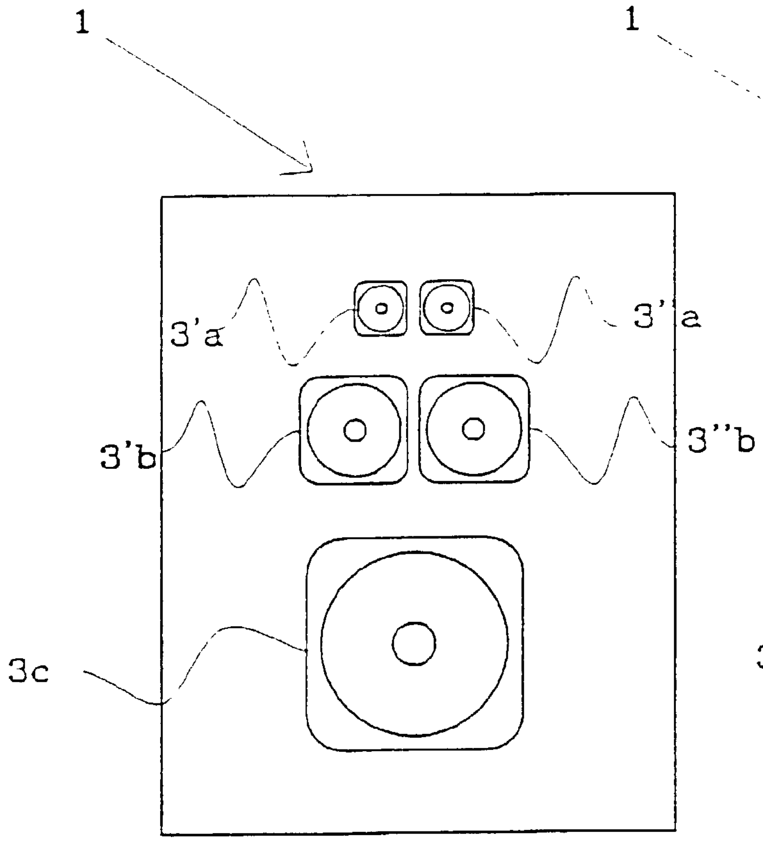
FIG. 5 is a front view of a second embodiment of a loudspeaker system.

FIG. 5 shows a second embodiment of an audio stereo sound reproducing system according to the invention, which cannot easily be divided into a left and a right unit. The sound reproducing system 1 comprises five loudspeaker elements 3'*a*, 3"*a*, 3'*b*, 3"*b*, and 3*c*. Loudspeaker elements 3'*a* and 3 "*a* constitute one loudspeaker pair, and loudspeaker elements 3'*b* and 3"*b*, constitute a second loudspeaker pair. The two elements in a pair of loudspeaker are identical. The distance between the centres of the elements is less than one quarter of the shortest wavelength emitted by the elements, or, if the shortest wavelength emitted by the elements is less than 68 cm, at least no longer than 17 cm. The loudspeaker elements in a pair are symmetrically positioned on opposite sides of an imaginary dividing plane (not shown). The two pairs constituted by elements 3'*a*, 3"*a*, and 3'*b*, 3"*b*, respectively, share a common dividing plane. Loudspeaker 3*c* is not a member of a loudspeaker element pair of this kind.

Figure 7:
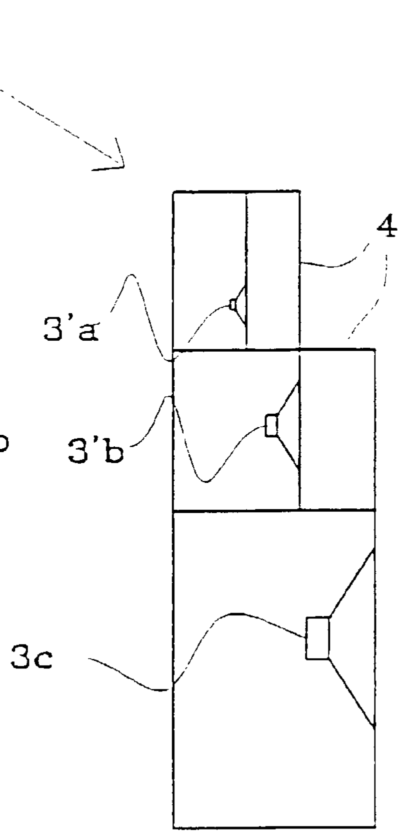
FIG. 7 is a partial cross sectional side view of the loudspeaker system shown in FIG. 5.
Figure 6:
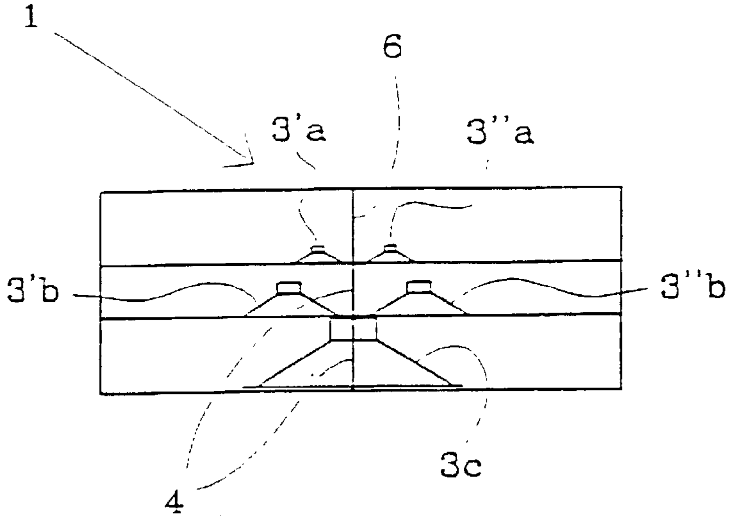
FIG. 6 is a partial cross sectional top view of the loudspeaker system shown in FIG. 5.

FIG. 6 shows the embodiment i FIG. 5 from above, and FIG. 7 shows it from the side. As clearly seen in these views, the two element pairs 3'*a*, 3"*a*, and 3'*b*, 3"*b* and the single element 3*c* are offset from each other and are positioned at different heights from the rear surface. Even so, the two pairs share a common dividing plane. Each pair is provided with a plate element 4, while the single loudspeaker 3*c* element is not. The two left elements in each pair 3'*a* and 3'*b* are acoustically isolated from the corresponding right elements 3"*a* and 3"*b*. The resonance volume for the single element is not divided into a right and a left side, and this resonance volume is acoustically isolated from the other resonance volumes.

The input audio stereo signal sent to a pair of loudspeaker elements, such as the pair comprising elements 3'*a*, 3"*a*, or the pair comprising element s3'*b*, 3"*b*, is processed according to the method disclosed here. The processing may be different between two pairs, in terms of the value of the attenuation factor α, or its optional frequency dependent, α(f).

Inasmuch as the present invention is subject to variations, modifications and changes in detail, some of which have been stated herein, it is intended that all matter described throughout this entire specification or shown in the accompanying drawings be interpreted as illustrative and not in a limiting sense.

The invention claimed is:

1. A method of processing an input audio stereo signal comprising two input signals, which are a mid input signal (M) and a side input signal (S), or of a kind from which a mid input signal (M) and a side input signal (S) are derivable, for reproduction of a processed stereo signal in an audio reproduction system comprising at least one pair of identical loudspeaker elements being acoustically isolated from each other and located within less than one quarter of the shortest wavelength emitted by the elements, or, if the shortest wavelength emitted by the elements is less than 68 cm, then the loudspeaker elements are located less than 17 cm, characterised by the steps of:

producing a left output signal for, transmission to a left loudspeaker of said pair, which is equivalent to the sum of the mid input signal (M) attenuated by a factor α and the side input signal (S), producing a right output signal for transmission to a right loudspeaker of said pair, which is equivalent to the sum of the mid input signal (M) attenuated by the factor α and the side signal (S) phase shifted 180°.

2. The method according to claim 1, characterized in that the attenuation factor α is in the range of −3 dB to −10 dB.

3. The method according to claim 1, characterized in that the attenuation factor α is in the range −5 dB to −10 dB.

4. The method according to claim 1, characterized in that the attenuation factor α is in the range −6 dB to −9 dB.

5. The method according to claim 1, characterized in that more than one pair of left and right output signals are produced, for reproduction in corresponding pairs of loudspeaker elements.

6. A method of processing an input audio stereo signal comprising two input signals, which are a left input signal (L) and a right input signal (R), or of a kind from which a left input signal (L) and a right input signal (R) are derivable, for reproduction of a processed stereo signal in an audio stereo production system comprising at least one pair of identical loudspeaker elements being acoustically isolated from each other and located within less than one quarter of the shortest wavelength emitted by the elements, or, if the shortest wavelength emitted by the elements is less than 68 cm, then the loudspeaker elements are located less than 17 cm, characterised by the steps of:

producing a left output signal, which is the sum of the left input signal (L) multiplied by a factor $\alpha+1$ and the right input signal (R) multiplied by a factor $\alpha-1$, producing a right output signal, which is the sum of the left input signal (L) multiplied by the factor $\alpha-1$ and the right input signal (R) multiplied by the factor $\alpha+1$.

7. The method according to claim 6, characterised in that the attenuation factor α is in the range −3 dB to −10 dB.

8. The method according to claim 6, characterised in that the attenuation a factor α is in the range −5 dB to −10 dB.

9. The method according to claim 6, characterised in that the attenuation a factor α is in the range −6 dB to −9 dB.

10. The method according to claim 6, characterized in that more than one pair of left and right output signals are produced, for reproduction in corresponding pairs of loudspeaker elements.

11. A device for processing an input audio stereo signal comprising two input signals, which are a mid input signal (M) and a side input signal (S), or of a kind from which a mid input signal (M) and a side input signal (S) are derivable, for reproduction of a processed stereo signal in an audio-stereo reproduction system comprising at least one pair of identical loudspeaker elements being acoustically isolated from each other and located within less than one quarter of the shortest wavelength emitted by the elements, or, if the shortest wavelength emitted by the elements is less than 63 cm, then the loudspeaker elements are located less than 17 cm, characterised in that the device is arranged to:

produce a left output signal for transmission to a left loudspeaker in said pair, which is equivalent to the sum of the mid input signal (M) attenuated by a factor α and the side input signal (S), produce a right output signal for transmission to a right loudspeaker in said pair, which is equivalent to the sum of the mid input signal (M) attenuated by the factor α and the side signal (S) phase shifted 180°.

12. The device according to claim 11, characterised in that the attenuation factor α is in the range −3 dB to −10 dB.

13. The device according to claim 11, characterised in that the attenuation factor α is in the range −5 dB to −10 dB.

14. The device according to claim 11, characterised in that the attenuation factor α is in the range −6 dB to −9 dB.

15. A device for processing an input audio stereo signal comprising two input signals, which are a left input signal (L) and a right input signal (R), or of a kind from which a left input signal (L) and a right input signal (R) are derivable, for reproduction of a processed stereo signal in an audio stereo reproduction system comprising at least one pair of identical loudspeaker elements being acoustically isolated from each other and located within less than one quarter of the shortest wavelength emitted by the elements, or, it the shortest wavelength emitted by the elements is less than 68 cm, then the loudspeaker elements are located less than 17 cm, characterized in that the device is arranged to:

produce a left output signal, which is the sum of the left input signal (L) multiplied by the factor α+1 and the right input signal (R) multiplied by a factor α−1, produce a right output signal, which is the sum of the left output signal (L) multiplied by the factor α−1 and the right output signal (R) multiplied by the factor α+1.

16. The device according to claim 15, characterised in that the attenuation factor α is in the range −3 dB to −10 dB.

17. The device according to claim 15, characterised in that the attenuation factor α is in the range −5 dB to −10 dB.

18. The device according to claim 15, characterised in that the attenuation factor α is in the range −6 dB to −9 dB.

19. An audio stereo signal reproduction system, suitable for reproducing an audio stereo signal processed according to the method claimed in claim 1, wherein the at least one pair of loudspeaker elements being acoustically isolated from each other, the elements of said pair being identical to each other and being symmetrically positioned on opposite sides of a dividing plane, and wherein the loudspeaker elements of said pair of elements are positioned with a distance between the centers of the elements of less than one quarter of the shortest wavelength emitted by the elements, or, if the shortest wavelength emitted by the elements is less than 68 cm, then the centers of the loudspeaker elements are located less than 17 cm.

20. An audio stereo signal reproduction system according to claim 19, characterised in that the loudspeaker element of said pair of loudspeaker elements are mounted adjacent to each other.

21. An audio stereo signal reproduction system according to claim 19, characterized in that said audio stereo signal reproduction system comprises more than one of said pairs of elements.

22. An audio stereo signal reproduction system according to claim 21, characterised in that said pairs share a common dividing plane.

23. An audio stereo signal reproduction system according to claim 22, characterised in that said pairs are arranged in one integral enclosure.

24. An audio stereo signal reproduction system according to claim 19, characterized in that a plate element (4) is disposed centrally between at least one said pair(s) of loudspeaker elements, extending from a front surface of said pair of loudspeaker elements.

25. An audio stereo signal reproduction system according to claim 24, characterised in that said plate element is fixed.

26. An audio stereo signal reproduction system according to claim 24, characterised in that said plate element is retractable.

27. An audio stereo signal reproduction system according to claim 24, characterized in that said plate element extends a distance from the front surface of said pair of loudspeaker elements equivalent to half of the distance between the centers of each loudspeaker element of said pair.

28. An audio stereo signal reproduction system according to claim 19, characterized in that the attenuation factor α is in the range −3 dB to −10 dB.

29. An audio stereo signal reproduction system according to claim 19, characterized in that the attenuation factor α is in the range −5 dB to −10 dB.

30. An audio stereo signal reproduction system according to claim 19, characterized in that the attenuation factor α is in the range of −6 dB to −9 dB.

* * * * *